(12) United States Patent
Guo et al.

(10) Patent No.: US 12,538,644 B2
(45) Date of Patent: Jan. 27, 2026

(54) DISPLAY PANEL AND PREPARATION METHOD THEREFOR, AND DISPLAY DEVICE

(71) Applicants: Chengdu BOE Optoelectronics Technology Co., Ltd., Chengdu (CN); BOE TECHNOLOGY GROUP CO., LTD., Beijing (CN)

(72) Inventors: Xiaoliang Guo, Beijing (CN); Tiaomei Zhang, Beijing (CN); Zhongfei Dong, Beijing (CN); Yan Hu, Beijing (CN); Hongguang Yuan, Beijing (CN); Jiamian Sun, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 614 days.

(21) Appl. No.: 17/638,845

(22) PCT Filed: Mar. 10, 2021

(86) PCT No.: PCT/CN2021/079922
§ 371 (c)(1),
(2) Date: Feb. 27, 2022

(87) PCT Pub. No.: WO2021/213046
PCT Pub. Date: Oct. 28, 2021

(65) Prior Publication Data
US 2022/0407032 A1    Dec. 22, 2022

(30) Foreign Application Priority Data

Apr. 24, 2020 (CN) .......... 202010333434.9

(51) Int. Cl.
*H10K 50/842*    (2023.01)
*H10K 59/12*    (2023.01)
*H10K 59/88*    (2023.01)

(52) U.S. Cl.
CPC ......... *H10K 50/8426* (2023.02); *H10K 59/88* (2023.02); *H10K 59/1201* (2023.02)

(58) Field of Classification Search
None
See application file for complete search history.

(56) References Cited

U.S. PATENT DOCUMENTS 10,276,646 B2    4/2019    Kim et al.
10,622,585 B2    4/2020    Kim et al.
(Continued)

FOREIGN PATENT DOCUMENTS

CN    108155216 A    6/2018
CN    110233161 A    9/2019
(Continued)

OTHER PUBLICATIONS

International Search Report and Written Opinion for International Application No. PCT/CN2021/079922 mailed Jun. 10, 2021.
(Continued)

*Primary Examiner* — Jay C Chang
(74) *Attorney, Agent, or Firm* — Perilla Knox & Hildebrandt LLP; Kenneth A. Knox

(57) ABSTRACT

A display panel and manufacturing method therefor and a display device are provided. The display panel includes: a base substrate; an insulation layer arranged at a peripheral area of the base substrate; at least one encapsulation dam arranged on a surface of the insulation layer away from the base substrate, the encapsulation dam being located in the peripheral area of the base substrate and being arranged around the display area; and at least one groove disposed in (Continued)

the insulation layer, a projection of the at least one groove on the base substrate being located within on a projection of the encapsulation dam on the base substrate.

16 Claims, 6 Drawing Sheets

(56) References Cited

U.S. PATENT DOCUMENTS

| | | | |
|---|---|---|---|
| 10,636,864 B2 | 4/2020 | Kim et al. | |
| 2016/0307971 A1* | 10/2016 | Jeon | H01L 22/30 |
| 2018/0159074 A1* | 6/2018 | Kim | H10K 50/844 |
| 2018/0166525 A1 | 6/2018 | Kim et al. | |
| 2019/0157607 A1 | 5/2019 | Kim et al. | |
| 2019/0221634 A1 | 7/2019 | Kim et al. | |
| 2019/0363275 A1* | 11/2019 | Ochi | H10K 50/125 |
| 2020/0136087 A1* | 4/2020 | Kim | H10K 59/122 |
| 2020/0219965 A1 | 7/2020 | Kim et al. | |
| 2020/0395573 A1 | 12/2020 | Zhang et al. | |

FOREIGN PATENT DOCUMENTS

| | | |
|---|---|---|
| CN | 111490181 A | 8/2020 |
| EP | 3764398 A1 | 1/2021 |
| GB | 2574281 A | 12/2019 |
| GB | 2574281 B | 1/2021 |
| IN | 108364987 A | 8/2018 |

OTHER PUBLICATIONS

First Office Action for CN Patent Application No. 202010333434.9 mailed Jan. 6, 2022.

* cited by examiner

DISPLAY PANEL AND PREPARATION METHOD THEREFOR, AND DISPLAY DEVICE

CROSS-REFERENCE TO RELATED APPLICATIONS

The present disclosure is a national phase application under 35 U.S.C. § 371 of International Application No. PCT/CN2021/079922 filed Mar. 10, 2021, which claims the benefit of and priority to Chinese Patent Application No. 202010333434.9, entitled "DISPLAY PANEL AND PREPARATION METHOD THEREFOR, AND DISPLAY DEVICE" filed on Apr. 24, 2020, where the contents of both of which are incorporated by reference in their entireties herein.

TECHNICAL FIELD

The present disclosure relates to the field of display technology, and particularly, to a display panel and manufacturing method thereof and further a display device.

BACKGROUND

An organic light-emitting display panel (OLED) is a self-luminous display, which has advantages such as low power consumption, fast response speed, high luminous efficiency, high brightness, and wide viewing angle, and may meet the requirements in aspects of thinning, light weight, portability, and high performance.

The requirement of a user for display effect is getting higher and higher, for which increasing the screen ratio becomes one of the main design directions. At present, the screen ratio is mainly increased by designing special-shaped screens (such as straight bang screen, water drop screen) to expand the display area. The screen ratio may also be increased by optimizing the circuit layout in the peripheral area to reduce the frame size. However, these methods have limited effect on increasing the screen ratio, and the user expects the screen ratio to be further increased.

It should be noted that the information disclosed in the above Background section is only for enhancement of understanding of the background of the present disclosure, and therefore may contain information that does not form the prior art that is already known to a person skilled in the art.

SUMMARY

The present disclosure is to provide a display panel and manufacturing method therefor and a display device.

An aspect of the present disclosure provides a display panel, including:
  a base substrate, including a display area and a peripheral area surrounding the display area;
  an insulation layer covering at least the peripheral area of the base substrate;
  at least one encapsulation dam, located on a surface of the insulation layer away from the base substrate, the encapsulation dam being located in the peripheral area of the base substrate and being arranged around the display area; and
  at least one groove, formed in the insulation layer, the groove being arranged around the display area, wherein a projection of the at least one groove on the base substrate is located within on a projection of the encapsulation dam on the base substrate.

In an exemplary embodiment of the present disclosure, the at least one encapsulation dam includes two encapsulation dams, and the two encapsulation dams surround the display area and are spaced apart from each other, and the projection of the groove on the base subject is located within the projection of at least one of the two encapsulation dams on the base substrate.

In an exemplary embodiment of the present disclosure, the projection of the groove on the base substrate is located within the projection of the encapsulation dam of the two encapsulation dams, being located farther from the display area, on the base substrate.

In an exemplary embodiment of the present disclosure, the display panel further includes: a crack detection line, located in the peripheral area of the base substrate and arranged around the display area, wherein a projection of the crack detection line on the base substrate is located between the projections of the two encapsulation dams on the base substrate, and the two encapsulation dams being adjacent to each other.

In an exemplary embodiment of the present disclosure, the display panel further includes: a crack detection line, located in the peripheral area of the substrate and arranged around the display area, wherein a projection of the crack detection line on the base substrate is located within the projection of the encapsulation dam on the base substrate.

In an exemplary embodiment of the present disclosure, the insulation layer covers the crack detection line, and in a covering area by the projection of the encapsulation dam, the crack detection line is located at a side of the groove near to or far from the display area.

In an exemplary embodiment of the present disclosure, the crack detection line is located on the surface of the insulation layer away from the base substrate, and the crack detection line is located between two adjacent grooves.

In an exemplary embodiment of the present disclosure, the display panel includes a plurality of crack detection lines, and projections of the plurality of crack detection lines on the base substrate are located within the projection of one of the two encapsulation dams on the base substrate or distributed within the projections of the plurality of encapsulation dams on the base substrate.

In an exemplary embodiment of the present disclosure, the insulation layer has a single-layer structure, and the groove is formed in the single-layer structure; or the insulation layer has a multi-layer structure, the groove penetrates through at least one layer of the multi-layer structure, and a bottom surface of the groove is located in a layer of the multi-layer structure closest to the base substrate.

In an exemplary embodiment of the present disclosure, the display panel further includes a pixel definition layer formed in the display area, wherein the encapsulation dam includes a first barrier layer, and the first barrier layer and the pixel definition layer are formed of a same material and provided in a same layer.

In an exemplary embodiment of the present disclosure, the display panel further includes a planarization layer formed in the display area, wherein the encapsulation dam further includes a second barrier layer disposed on a surface of the first barrier layer facing the base substrate, and the second barrier layer and the planarization layer are formed of a same material and provided in a same layer.

In an exemplary embodiment of the present disclosure, the encapsulation dam includes a first encapsulation dam and a second encapsulation dam, the second encapsulation dam surrounds a side of the first encapsulation dam away from the display area, the first encapsulation dam includes the first barrier layer, and the second encapsulation dam includes the first barrier layer and the second barrier layer.

Another aspect of the present disclosure provides a display device, including any of the above display panels.

Yet another aspect of the present disclosure provides a method for manufacturing a display panel, including:
- providing a base substrate with a display area and a peripheral area surrounding the display area being divided;
- forming an insulation layer in the peripheral area of the base substrate;
- forming at least one encapsulation dam on a surface of the insulation layer away from the base substrate so that the encapsulation dam is arranged in the peripheral area of the base substrate and around the display area; and
- forming at least one groove in the insulation layer so that the grooves are arranged around the display area and spaced apart from each other, wherein a projection of the at least one groove on the base substrate is located within on a projection of the encapsulation dam on the base substrate.

In an exemplary embodiment of the present disclosure, the method further includes: forming a crack detection line in the peripheral area of the base substrate and around the display area, wherein a projection of the crack detection line on the base substrate is located between projections of two adjacent encapsulation dams on the base substrate, or the projection of the crack detection line on the base substrate is located within the projection of the encapsulation dam on the base substrate.

It should be understood that the above general description and the following detailed description are only exemplary and explanatory, and cannot limit the present disclosure.

BRIEF DESCRIPTION OF THE DRAWINGS

The accompanying drawings, which are incorporated in and constitute a part of this specification, illustrate embodiments in accordance with the present disclosure, and together with the description, serve to explain the principle of the present disclosure. Understandably, the drawings in the following description are only some embodiments of the present disclosure, and for a person skilled in the art, other drawings may also be obtained from these drawings without creative efforts.

DETAILED DESCRIPTION

Figure 1:
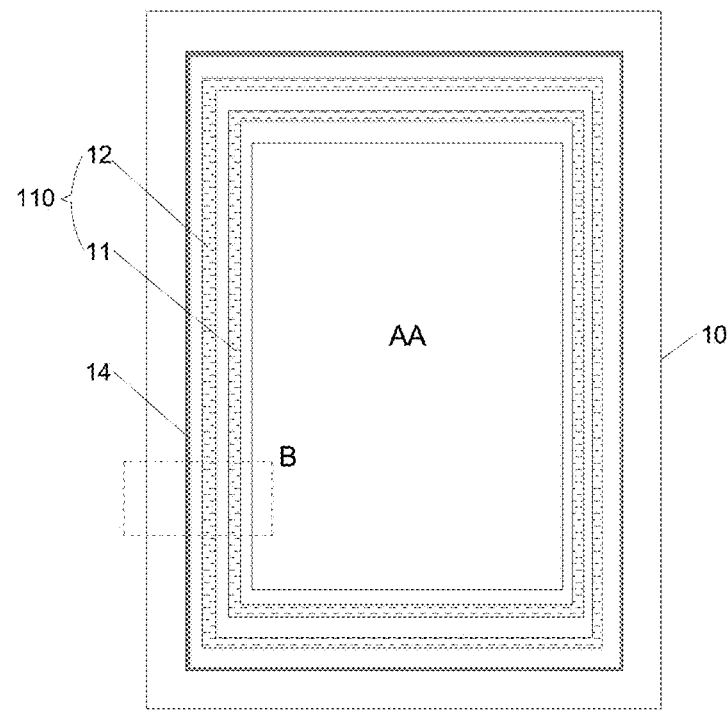
FIG. 1 is a schematic top view of a display panel according to an embodiment.

Example embodiments will now be described more fully with reference to the accompanying drawings. Example embodiments, however, may be embodied in various forms and should not be construed as being limited to the embodiments set forth herein; rather, these embodiments are provided so that the present disclosure will be thorough and complete, and will fully convey the concept of example embodiments to a person skilled in the art. The same reference numerals in the drawings denote the same or similar structures, and thus detailed descriptions thereof will be omitted.

Figure 2:
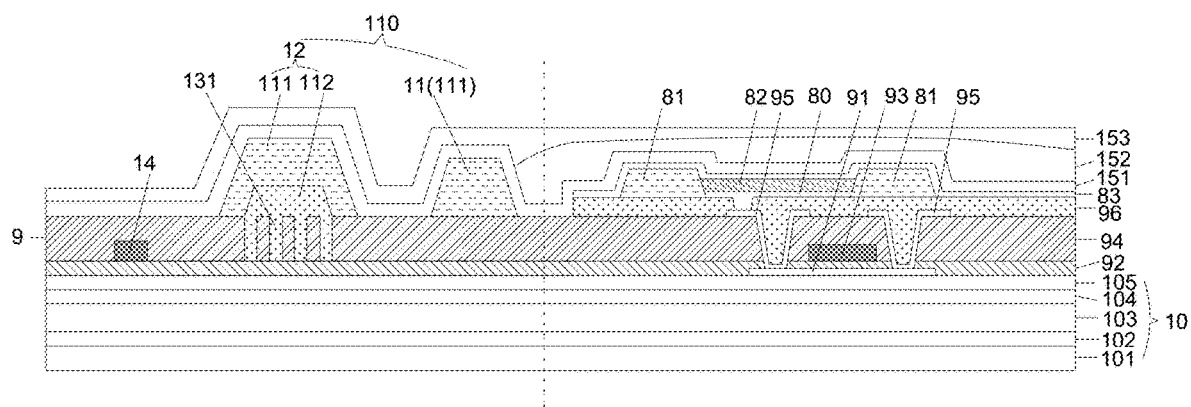
FIG. 2 is a schematic cross-sectional view of a display panel according to an embodiment.
Figure 3:
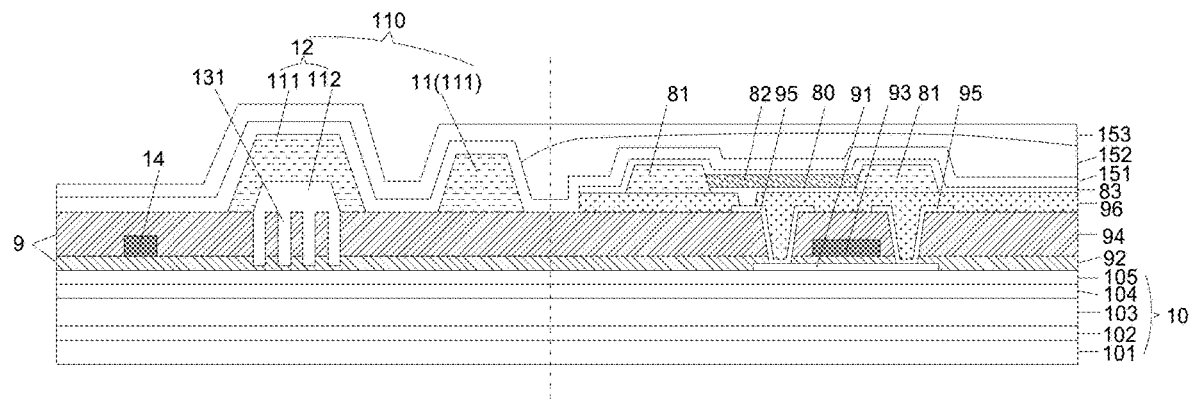
FIG. 3 is another schematic cross-sectional view of a display panel according to an embodiment.

An embodiment of the present disclosure provides a display panel. FIG. 1 is a schematic top view of a display panel according to an embodiment, in which AA represents a display area and an area outside the AA area is a peripheral area. FIG. 2 is a partial structural cross-sectional view of a display panel according to an embodiment in which the vertical dashed-line is used to distinguish the display area from the peripheral area, the right side thereof is the display area, the left side thereof is the peripheral area, and only main structures relevant to the present disclosure are shown in the display area and the non-display area. FIG. 3 is a partially enlarged perspective view of a dashed-line block B in the peripheral area in FIG. 1, which corresponds to the cross-sectional structure of FIG. 2. As can be seen from these figures, the display panel includes a base substrate 10, and the base substrate 10 includes a display area and a peripheral area surrounding the display area. An insulation layer 9 is provided in the peripheral area, an encapsulation dam 110 is provided on a surface of the insulation layer 9 away from the base substrate 10, and an extending direction of the encapsulation dam 110 is the same as that of the edge of the display area. At least one groove 131 is also formed in the insulation layer 9, the groove 131 is arranged in the peripheral area of the base substrate 10 and surrounds the display area, and the groove 131 is located between the encapsulation dam 110 and the base substrate 10. A projection of the at least one groove 131 on the base substrate 10 is located within a projection of the encapsulation dam 110 on the base substrate 10.

As shown in FIG. 1, the encapsulation dam 110 is an annular protrusion disposed around the display area, which may prevent an overflow of organic encapsulation material from affecting pads disposed in the peripheral area during thin film encapsulation.

During the manufacturing and using of the display panel, cracks are likely to occur in an inorganic material layer in an edge area of the display panel due to effects from, for example cutting processes, transportation, or bending. If the crack extends into the interior of the display panel, it may damage important components in the display panel, and allow external water, oxygen, and the like to penetrate into the interior of the display panel, thereby affecting product yield and increasing production costs. In the present disclosure, the groove 131 is arranged in the insulation layer 9. Once a crack occurs at the edge of the panel, the groove 131 may change the crack extension direction, and may also expand the crack extension path, which has a function of retarding or preventing the crack from extending to the display area, and thus can prevent the structure of the display area from being damaged and improve the encapsulation effect. The groove 131 is located under the encapsulation dam 110, which may reduce the occupation area thereof and the width of the peripheral area, thereby increasing the screen ratio.

The display panel according to an embodiment of the present disclosure will be described in detail below.

In an embodiment, the display area of the base substrate 10 is used for arranging structures such as organic light-emitting devices, thin film transistors, pixel capacitors and the like, and the non-display area is used for arranging driving circuits, encapsulation structures, and the like.

The base substrate 10 may be any transparent substrate, such as a glass substrate, a quartz substrate, a plastic substrate or other transparent rigid or flexible substrates, which may be a single-layer or multi-layer structure. In the embodiment shown in FIG. 2, the base substrate 10 is a multi-layer structure, which includes a first PI (polyimide) layer 101, a first protection layer 102, a second PI (polyimide) layer 103, and a second protection layer 104 which are stacked from bottom to top. The two protection layers are used to protect and prevent the PI layer from being damaged by subsequent processes. The second protection layer 104 is also covered with a buffer layer 105, which may block water, oxygen, and alkaline ions.

In an embodiment of the present disclosure, a thin film transistor may be of a top-gate or bottom-gate structure. Taking the top-gate structure as an example, referring to FIG. 2, the thin film transistor at least includes an active layer 91, a gate insulation layer 92, a gate electrode layer 93, a dielectric layer 94, a source/drain layer 95, and a planarization layer 96. The active layer 91 is disposed on the base substrate 10, the gate insulation layer 92 covers the active layer 91, the gate electrode layer 93 is disposed on a surface of the gate insulation layer 92 away from the base substrate 10, the dielectric layer 94 covers the gate insulation layer 92 and the gate electrode layer 93, the source/drain layer 95 is provided on a surface of the insulation layer away from the base substrate 10, the source/drain layer 95 includes source and drain electrodes connected to both ends of the active layer 91, and the planarization layer 96 covers the source/drain layer 95 and the dielectric layer 94. In addition, in order to further improve the efficiency of the transistor, the thin film transistor may be further optimized, for example, a second gate electrode and other structures may be further provided. The main layers are described above, however the specific structure of the thin film transistor is not limited in the present disclosure.

An organic light emitting device is for example a top-emitting device, which includes an anode layer 80, a pixel definition layer 81 disposed on the anode layer 80 and having an opening exposing a part of the anode layer, a light emitting layer 82 disposed in the opening and covering the anode layer 80, and a cathode layer 83 covering the light emitting layer 82 and the pixel definition layer 81. The anode layer 80 of the organic light emitting device and the drain electrode of the thin film transistor are electrically connected through a via hole, so that the organic light emitting device may emit light or be turned off under the control of the thin film transistor. The organic layer may include film layers such as a hole injection layer, a hole transport layer, a light emitting layer, an electron transport layer, an electron injection layer, and the like.

The display panel may further include an encapsulation film layer for preventing external moisture or oxygen from penetrating into the organic light emitting device and thus affecting the same. Specifically, the encapsulation film layer may include two inorganic encapsulation layers and an organic encapsulation layer disposed between the two inorganic encapsulation layers, that is, a first inorganic encapsulation layer 151, an organic encapsulation layer 152 and a second inorganic encapsulation layer 153 are sequentially arranged on the organic light emitting device from bottom to top. The two inorganic encapsulation layers function to prevent water and oxygen from being penetrating, and the organic encapsulation layer serves as a buffer to reduce stress between layers due to bending of the display panel and enhance planarization. The organic encapsulation layer 152 covers at least the display area and is blocked by the encapsulation dam 11, and the two inorganic encapsulation layers cover the display area and part of the non-display area.

In an embodiment, taking the encapsulation dam 11 at the right side in FIG. 2 as an example, the encapsulation dam 110 includes a first barrier layer 111, which may be formed of the same material and provided in the same layer as the pixel definition layer 81 in the display area. In the present disclosure, being provided in the same layer refers to being formed through the same one-step patterning process, which is denoted by the same filling line in the following figures. Specifically, the pixel definition layer 81 may be also formed in the peripheral area while the pixel definition layer 81 in the display area is formed, and then the pixel definition layer 81 in the peripheral area is patterned through the same patterning process to form the first barrier layer 111 having a protrusion structure as shown in FIG. 2.

Further, taking the encapsulation dam 12 on the left side in FIG. 2 as an example, the encapsulation dam 110 may further include a second barrier layer 112, and the second barrier layer 112 is disposed on a surface of the first barrier layer 111 facing the base substrate 10, that is, the second barrier layer 112 is disposed under the first barrier layer 111, and the two barrier layers increase the height of the entire encapsulation dam, thereby having a better overflow prevention effect. The second barrier layer 112 and the planarization layer of the display area may be formed of the same material and provided in the same layer. Specifically, the planarization layer 96 may also be formed in the peripheral area while the planarization layer 96 in the display area is formed, and then the planarization layer 96 in the peripheral area is patterned through the same patterning process to form the second barrier layer 112 having a protrusion structure as shown in FIG. 2.

In an embodiment of the present disclosure, the insulation layer 9 has a single-layer structure. For example, as shown in FIG. 2, the insulation layer and the dielectric layer 94 in the display area may be provided in the same layer and formed of the same material. Specifically, the dielectric layer 94 may also be formed in the peripheral area as the insulation layer 9 while the dielectric layer 94 in the display area is formed, and then the dielectric layer 94 in the peripheral area may be patterned through the same patterning process to remove part of the dielectric layer 94 in a target area to form the grooves 131 in the target area, and a strip-like structure formed of insulation material is formed between adjacent grooves 131.

In another embodiment, the insulation layer 9 has a multi-layer structure, that is, in addition to the dielectric layer 94, it may also include other film layers, in this case, the groove penetrates an upper film layer and a bottom surface of the groove is located in a layer closest to the base substrate. For example, as shown in FIG. 3, the insulation layer 9 includes two layers with a lower layer being the gate insulation layer 92 and an upper layer being the dielectric layer 94. The groove penetrates through the dielectric layer 94 and the bottom surface of the groove is located in the gate insulation layer 92. The forming process of the groove with such structure may specifically include: forming the dielectric layer and the gate insulation layer in the peripheral area while forming the dielectric layer and the gate insulation layer in the display area, and then patterning the dielectric layer and the gate insulation layer in the peripheral area through a corresponding patterning process. The dielectric layer and the gate insulation layer may be patterned to form the grooves 131. Of course, according to the film layer structure of the display area, the insulation layer may further include other insulation material layers, and the gate insulation layer 92 may further include a plurality of gate insulation layers, which will not be repeated here.

It should be noted that, since the groove 131 is located under the encapsulation dam 110, when the encapsulation dam 110 is formed, the material of the encapsulation dam 110 will be automatically filled in the groove 131, however such structure will not affect the effect of the groove 131 preventing crack extension, on the contrary, it will become the obstacle of crack extension and effectively prevent crack extension.

It should also be noted that the cross-sectional shapes of the encapsulation dam 110 and the groove 131 shown in the figure are only examples, and the cross-sectional shapes of the two may be rectangular, arc-shape, trapezoid or any other structure. The blocking effect can be achieved as long as the encapsulation dam 110 forms a protrusion on the base substrate, and the rack extension may be blocked as long as there is a space between the grooves 131. In addition, the number of the grooves 131 may be one or more. If there are a plurality of grooves 131, the plurality of grooves 131 are spaced from each other. The specific number of the grooves 131 may be set according to requirements, which is not limited in the present disclosure.

In some embodiments, there may be a plurality of encapsulation dams 110, and the respective encapsulation dams 110 are annular protrusions spaced apart from each other from the inside to the outside and surrounding the display area, so as to improve the anti-overflow effect. There may be a plurality of grooves 131, which are arranged in parallel around the display area, so as to improve the prevention of crack extension. In the present disclosure, the term "a plurality of . . . " refers to a quantity of two or more.

For example, FIGS. 5, 7, 9, 11 and 13 are all partially enlarged perspective views of other five structures of the dashed-line block B in the peripheral area in FIG. 1 (reference numerals 11 and 12 in the figures represent areas covered by projections of the encapsulation dams), and FIGS. 6, 8, 10, 12 and 14 are corresponding schematic cross-sectional views respectively. In these embodiments, the encapsulation dam includes a first encapsulation dam 11 and a second encapsulation dam 12, and the second encapsulation dam 12 is located on a side of the first encapsulation dam 11 away from the display area. In these embodiments, the first encapsulation dam 11 includes only the first barrier layer 111, the second encapsulation dam 12 includes the first barrier layer 111 and the second barrier layer 112, and a distance from an upper surface of the second encapsulation dam 12 to the base substrate 10 is greater than a distance from an upper surface of the first encapsulation dam 11 to the base substrate 10, that is, the second encapsulation dam 12 is higher than the first encapsulation dam 11, which can better prevent the organic encapsulation material from overflowing.

Specifically, in the embodiments shown in FIGS. 2-6, the insulation layer has four grooves 131 arranged in parallel. The projections of the four grooves 131 on the base substrate 10 are all located within the projection of the second encapsulation dam 12 on the base substrate 10, that is, the four grooves 131 are all located directly under the second encapsulation dam 12, which may save the area of the peripheral area to the greatest extent, and may also achieve anti-cracking and anti-overflowing effects. Of course, in other embodiments, the projections of the four grooves 131 on the base substrate 10 may also all be located within the projection of the first encapsulation dam 11 on the base substrate 10, that is, the four grooves 131 are all located directly under the base substrate 10, which may achieve similar effects. However, in comparison with the grooves 131 being located under the first encapsulation dam, the grooves 131 being located under the second encapsulation dam 12 may prevent the crack from extending from the outermost side, and thus retard or prevent the crack from extending to the inside to the greatest extent.

Similarly, when the number of encapsulation dams is greater than two, the projection of each groove 131 on the base substrate 10 is located in the projection of the encapsulation dam farthest from the display area on the base substrate 10, that is, the groove 131 is arranged under the outermost encapsulation dam, which may prevent crack from extending to the greatest extent.

Figure 7:
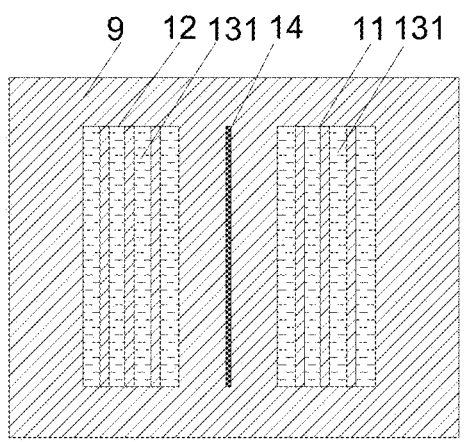
FIG. 7 is a third partial enlarged perspective view of a dashed-line block B in a peripheral area in FIG. 1.
Figure 8:
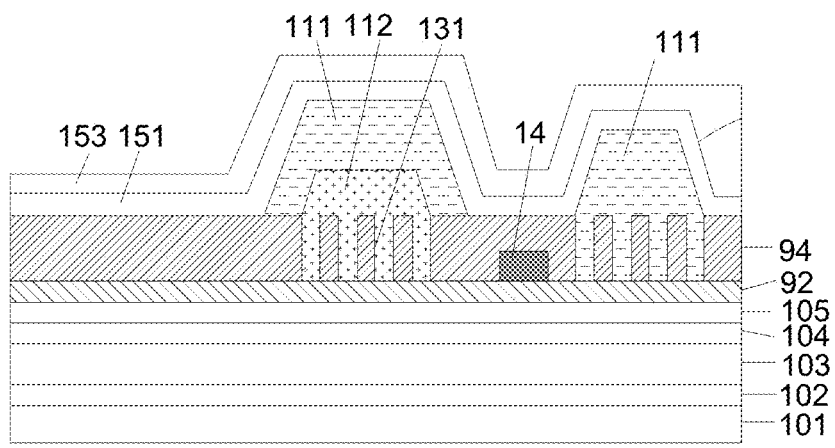
FIG. 8 is a schematic cross-sectional view of FIG. 7.

In the embodiment shown in FIGS. 7 to 8, the encapsulation dam includes a first encapsulation dam 11 and a second encapsulation dam 12, and the second encapsulation dam 12 is located at a side of the first encapsulation dam 11 away from the display area. Eight grooves 131 are arranged in the insulation layer in parallel.

The projections of four grooves 131 on the base substrate 10 are located within the projection of the second encapsulation dam 12 on the base substrate 10, and the projections of the other four grooves 131 on the base substrate 10 are located within the projection of the first encapsulation dam 11 on the base substrate 10. That is, the four grooves 131 are all located directly under the second encapsulation dam 12, and the other four grooves 131 are all located directly under the first encapsulation dam 11. In this way, more grooves 131 may be provided to further improve the anti-cracking effect, and additional peripheral area may be avoided. Of course, in other embodiments, the eight grooves 131 may also be distributed in the two encapsulation dams in other distribution manners, which may also achieve similar effects.

Similarly, when the number of encapsulation dams is greater than two, the projection of each groove 131 on the base substrate 10 is arranged within the projection of each encapsulation dam on the base substrate 10, and the projection of each encapsulation dam on the base substrate 10 includes the projection of at least one groove 131, that is, under each encapsulation dam is provided with the groove 131, which may prevent the crack from extending to the greatest extent without increasing the area of the peripheral area.

It should be noted that the greater the number of grooves 131 per unit area, the larger the surface area of the grooves 131 and the more difficult the crack extends. Therefore, the number of grooves 131 may be set according to product design requirements and structural strength.

In an embodiment of the present disclosure, the display panel further includes a crack detection (panel crack detection (PCD)) line 14. The crack detection line 14 is used to detect the crack of the display panel, which usually is a metal line and is arranged around the display area. The crack detection line 14 is connected to several data lines of the display area. When the crack detection line 14 is broken, the resistance of the broken detection line will be increased, so that the connected data lines are insufficiently written, and finally there will be several non-bright lines, thereby achieving the detection of a broken film layer.

The crack detection line 14 may be formed of the same material as at least one of the gate layer 93, the source electrode or the drain electrode of the thin film transistor through a one-step patterning process.

Figure 4:
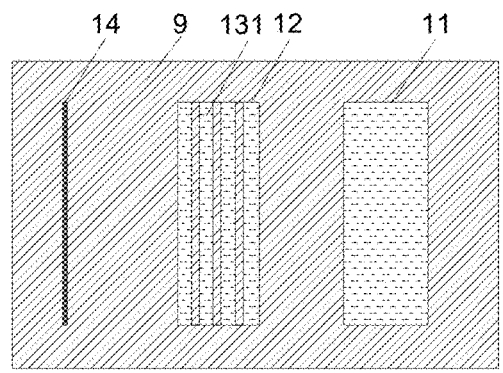
FIG. 4 is a first partial enlarged perspective view of a dashed-line block B in a peripheral area in FIG. 1.
Figure 5:
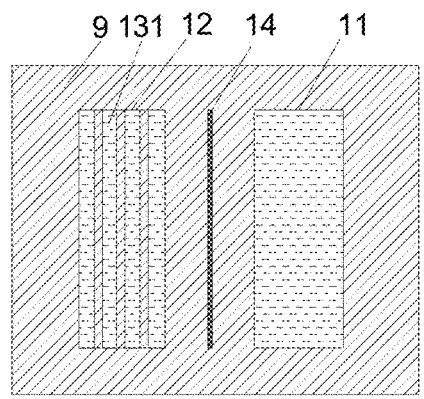
FIG. 5 is a second partial enlarged perspective view of a dashed-line block B in a peripheral area in FIG. 1.
Figure 6:
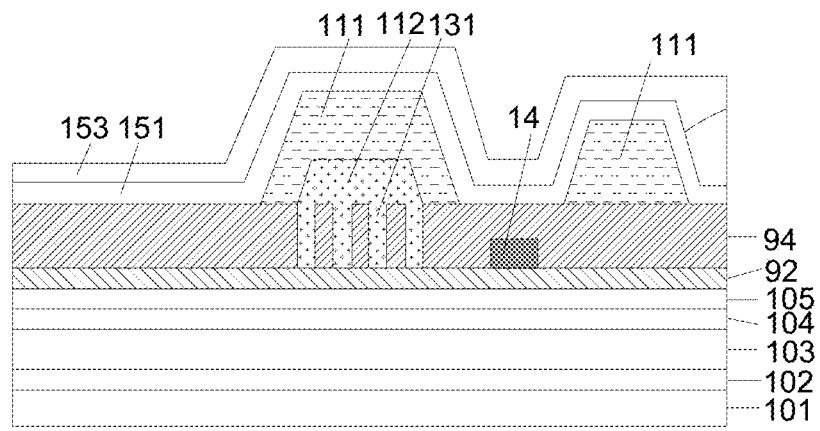
FIG. 6 is a schematic cross-sectional view of FIG. 5.

In the embodiment shown in FIGS. 2 to 4, the display panel includes a crack detection line 14, and the projection of the crack detection line 14 on the base substrate 10 is located outside the projections of the first encapsulation dam 11 and the second encapsulation dam 12, and the crack detection line 14 is located at a side of the second encapsulation dam 12 away from the display area.

In the embodiment shown in FIGS. 5 to 8, the projection of the crack detection line 14 on the base substrate 10 is located between the projections of the first encapsulation dam 11 and the second encapsulation dam 12 on the base substrate 10, that is, the crack detection line 14 is provided between the first encapsulation dam 11 and the second encapsulation dam 12. The crack detection line 14 is provided by using the existing area between the first encapsulation dam 11 and the second encapsulation dam 12, which can realize the crack detection without increasing the additional peripheral area, thereby reducing the frame.

Similarly, when the number of encapsulation dams is greater than two, the projection of the crack detection line 14 on the base substrate 10 is located between the projections of two adjacent encapsulation dams on the base substrate 10, that is, the crack detection line 14 may be provided between any two adjacent encapsulation dams.

In the embodiment shown in FIGS. 9 to 12, the display panel includes a crack detection line 14, and the projection of the crack detection line 14 on the base substrate 10 is located within the projection of the second encapsulation dam 12 on the base substrate 10, that is, the crack detection line 14 is disposed directly under the second encapsulation dam 12, which may realize crack detection without occupying the area between the two encapsulation dams, and thus the area of the peripheral area may be reduced to the greatest extent. Of course, in other embodiments, the projection of the crack detection line 14 on the base substrate 10 may also be located within the projection of the first encapsulation dam 11 on the base substrate 10, that is, the crack detection line 14 is located directly under the first encapsulation dam 11, which may achieve the same effect.

Similarly, when the number of encapsulation dams is greater than two, the projection of the crack detection line 14 on the base substrate 10 is located within the projection of any encapsulation dam on the base substrate 10.

In the above structure, both the crack detection line 14 and the groove 131 are arranged directly under the encapsulation dam, which may have the following two specific arrangement manners.

Figure 9:
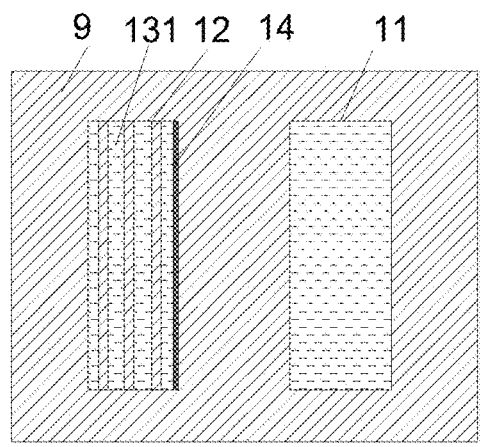
FIG. 9 is a fourth partial enlarged perspective view of a dashed-line block B in a peripheral area in FIG. 1.
Figure 10:
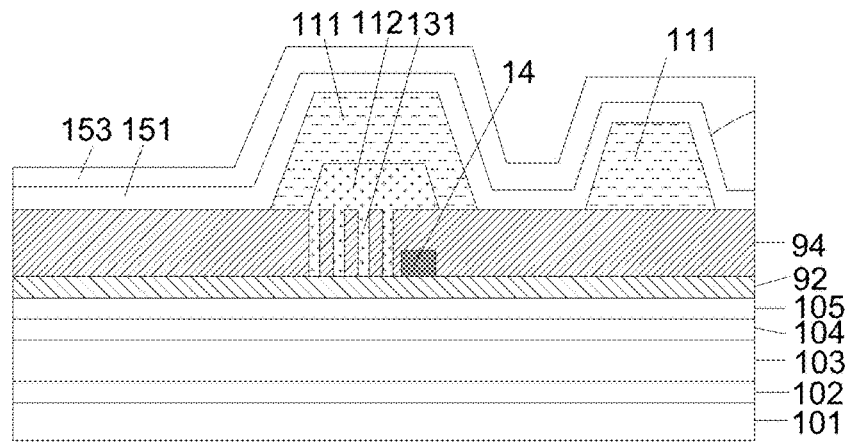
FIG. 10 is a schematic cross-sectional view of FIG. 9.

In the embodiment as shown in FIGS. 9 and 10, the insulation layer 9 covers the crack detection line 14, and the projection of the crack detection line 14 on the base substrate 10 is not overlapped with the projections of the four grooves 131 on the base substrate 10, that is, the rack detection line 14 and the four grooves 131 are arranged in parallel on the horizontal plane of the base substrate 10. As shown in FIG. 9, the crack detection line 14 under the second encapsulation dam 12 is located at the right side of the four grooves 131, of course, the crack detection line 14 may also be located at the left side of the four grooves 131. If the crack detection line 14 is provided in the same layer as the gate layer 93, when the structure is formed, the crack detection line 14 is formed first, and then the insulation layer 9 and the groove 131 are formed, so the crack detection line 14 is covered by the insulation layer 94.

Figure 11:
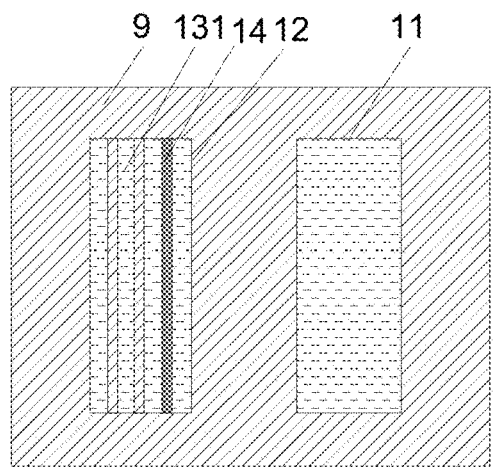
FIG. 11 is a fifth partial enlarged perspective view of a dashed-line block B in a peripheral area in FIG. 1.
Figure 12:
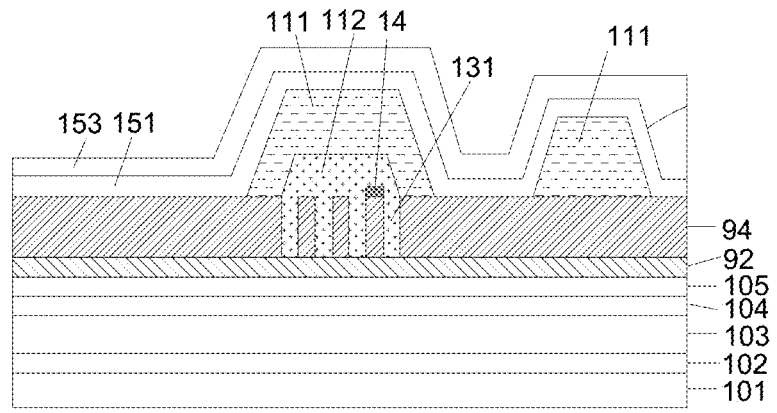
FIG. 12 is a schematic cross-sectional view of FIG. 11.

In another embodiment shown in FIGS. 11 and 12, the crack detection line 14 is located on a surface of the insulation layer 9 away from the base substrate 10, and the crack detection line 14 is located between the right two grooves 131. That is, the crack detection line 14 is located on the insulation layer between the right two grooves 131. In comparison with the previous embodiment, such structure occupies a smaller lateral area, which may reduce the size of the encapsulation dam, and thus further reduce the size of the peripheral area. Of course, the crack detection line 14 may also be disposed on the insulation layer between any other two grooves 131. When forming such structure, since the crack detection line 14 is located on the insulation layer 9, the insulation layer 9 shall be formed first.

Figure 13:
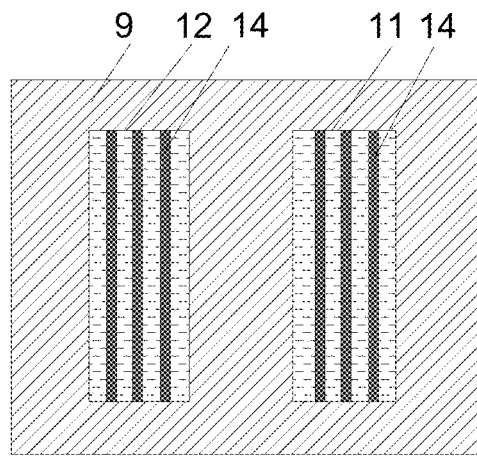
FIG. 13 is a sixth partial enlarged perspective view of a dashed-line block B in a peripheral area in FIG. 1.
Figure 14:
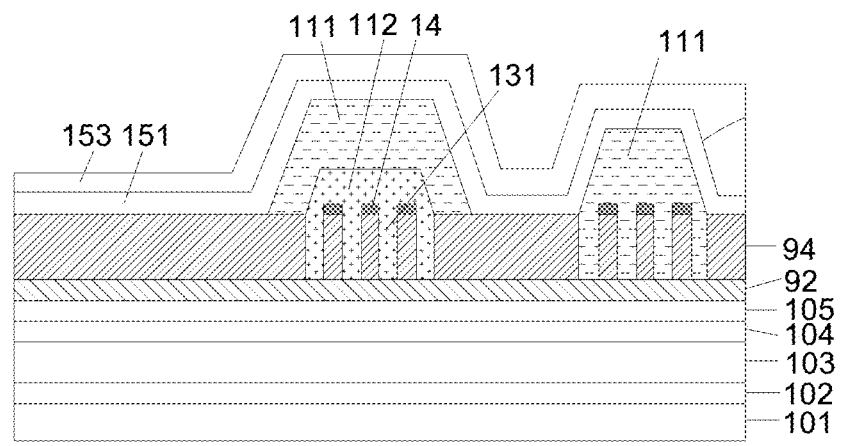
FIG. 14 is a schematic cross-sectional view of FIG. 13.

In yet another embodiment as shown in FIGS. 13 and 14, the number of crack detection lines 14 is six, and the projections of the respective crack detection lines 14 on the base substrate 10 are distributed within the projections of the two encapsulation dams on the base substrate 10, which may not only perform the detection at a plurality of locations or realize auxiliary detection, but also minimize the size of the peripheral area. In the figure, each crack detection line 14 is disposed on the insulation layer between adjacent grooves 131.

Embodiments of the present disclosure further provide a display device including the display panel of the above-mentioned embodiments. Since the display device has the above-mentioned display panel, it has the same beneficial effects, which will not be repeated in the present disclosure.

The present disclosure does not specifically limit the application of the display device, which may be any product and component with a display function, such as a TV, a notebook computer, a tablet computer, a wearable display device, a mobile phone, a car display, a navigation, an e-book, a digital photo frame and an advertising light box.

Figure 15:
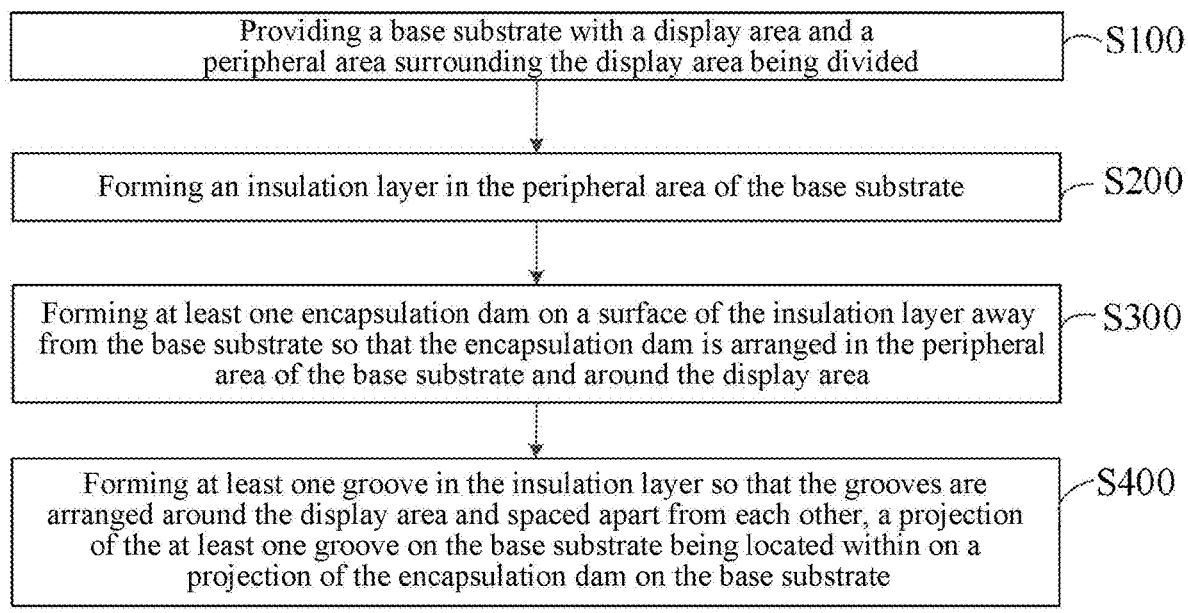
FIG. 15 is a flow chart for manufacturing a display panel according to an embodiment.

An embodiment also provides a method for manufacturing the above-mentioned display panel, referring to FIGS. 2 and 15, including:

step S100, providing a base substrate 10 with a display area and a peripheral area surrounding the display area being divided;

step S200, forming an insulation layer 9 in the peripheral area of the base substrate 10;

step S300, forming at least one encapsulation dam 110 on a surface of the insulation layer 9 away from the base substrate 10 so that the encapsulation dam 110 is arranged in the peripheral area of the base substrate 10 and around the display area; and step S400, forming at least one groove 131 in the insulation layer 9 so that the grooves 131 are arranged around the display area and spaced apart from each other, wherein a projection of the at least one groove 131 on the base substrate is located within on a projection of the encapsulation dam 110 on the base substrate.

Further, the method further includes: forming a crack detection line 14 in the peripheral area of the base substrate 10 and around the display area, wherein a projection of the crack detection line 14 on the base substrate 10 is located between projections of two adjacent encapsulation dams on the base substrate 10, or the projection of the crack detection line 14 on the base substrate 10 is located within the projection of the encapsulation dam on the base substrate 10.

The forming method of each film layer and structure in the above steps has been described in the description regarding the structure of the display panel. Of course, a person skilled in the art knows that the above film layer and structure may also be prepared by other conventional technical means in the field, which will not be repeated here.

Although relative terms such as "upper" and "lower" are used in the specification to describe the relative relationship of one component to another component shown, these terms are used in the specification only for convenience of description according to the example direction shown in the figures. It will be appreciated that if a device shown is turned upside down, the component described as "upper" will become the component as "lower". When a certain structure is "on" another structure, it may mean that the structure is integrally formed on said another structure, or that the structure is arranged "directly on" said another structure, or that the certain structure is arranged "indirectly on" said another structure through an additional structure.

The terms "a", "an", "the", "said" and "at least one" are used to indicate the presence of one or more elements/components/etc.; the terms "include" and "have" are used to indicate an open-ended inclusive means and means that additional elements/components/etc. may be present in addition to the listed elements/components/etc.

A person skilled in the art may easily conceive of other embodiments of the present disclosure upon consideration of the specification and practice of the invention disclosed herein. The present disclosure is intended to cover any variations, uses, or adaptations of the present disclosure that follow the general principle of the present disclosure and include common general knowledge or techniques in the technical field not disclosed by the present disclosure. The specification and examples are to be regarded as exemplary only, with the true scope and spirit of the present disclosure being indicated by the appended claims.

What is claimed is:

1. A display panel, comprising:
a base substrate comprising a display area and a peripheral area surrounding the display area;
an insulation layer covering at least the peripheral area of the base substrate;
a plurality of encapsulation dams located on a surface of the insulation layer away from the base substrate, the plurality of encapsulation dams being located in the peripheral area of the base substrate and being arranged around the display area, wherein the plurality of encapsulation dams comprise a first encapsulation dam and a second encapsulation dam, and the second encapsulation dam is higher than the first encapsulation dam and is arranged around a side of the first encapsulation dam away from the display area; and
at least one groove formed in the insulation layer, the groove being arranged around the display area, wherein a projection of the at least one groove on the base substrate is located within a projection of at least one encapsulation dam of the first encapsulation dam and the second encapsulation dam on the base substrate, wherein a material of the at least one encapsulation dam is filled in the groove, and
wherein the display panel further comprises a pixel definition layer formed in the display area, wherein each of the first encapsulation dam and the second encapsulation dam comprises a first barrier layer, and the first barrier layer and the pixel definition layer are formed of a same material and provided in a same layer.

2. The display panel according to claim 1, wherein the projection of the groove on the base substrate is located within a projection of the second encapsulation dam on the base substrate.

3. The display panel according to claim 1, further comprising:
a crack detection line located in the peripheral area of the base substrate and arranged around the display area, wherein a projection of the crack detection line on the base substrate is located between projections of the first encapsulation dam and the second encapsulation dam on the base substrate, and the first encapsulation dam and the second encapsulation dam being adjacent to each other.

4. The display panel according to claim 1, further comprising:
a crack detection line located in the peripheral area of the base substrate and arranged around the display area, wherein a projection of the crack detection line on the base substrate is located within a projection of at least one encapsulation dam of the plurality of encapsulation dams on the base substrate.

5. The display panel according to claim 4, wherein the insulation layer covers the crack detection line, and in a covering area by the projection of the at least one encapsulation dam of the plurality of encapsulation dams, the crack detection line is located at a side of the groove near to or far from the display area.

6. The display panel according to claim 4, wherein the crack detection line is located on the surface of the insulation layer away from the base substrate, and the crack detection line is located between two adjacent grooves.

7. The display panel according to claim 6, wherein the display panel comprises a plurality of crack detection lines, and projections of the plurality of crack detection lines on the base substrate are located within a projection of the first encapsulation dam or the second encapsulation dam on the base substrate or distributed within projections of the plurality of encapsulation dams on the base substrate.

8. The display panel according to claim 1, wherein the insulation layer has a single-layer structure, and the groove is formed in the single-layer structure; or
the insulation layer has a multi-layer structure, the groove penetrates through at least one layer of the multi-layer structure, and a bottom surface of the groove is located in a layer of the multi-layer structure closest to the base substrate.

9. The display panel according to claim 1, further comprising a planarization layer formed in the display area,
wherein the second encapsulation dam further comprises a second barrier layer disposed on a surface of the first barrier layer facing the base substrate, and the second barrier layer and the planarization layer are formed of a same material and provided in a same layer.

10. A display device, comprising:
a display panel, wherein the display panel comprises:
a base substrate comprising a display area and a peripheral area surrounding the display area;

an insulation layer covering at least the peripheral area of the base substrate;

a plurality of encapsulation dams located on a surface of the insulation layer away from the base substrate, the plurality of encapsulation dams being located in the peripheral area of the base substrate and being arranged around the display area, wherein the plurality of encapsulation dams comprise a first encapsulation dam and a second encapsulation dam, and the second encapsulation dam is higher than the first encapsulation dam and is arranged around a side of the first encapsulation dam away from the display area; and at least one groove formed in the insulation layer, the groove being arranged around the display area, wherein a projection of the at least one groove on the base substrate is located within a projection of at least one encapsulation dam of the first encapsulation dam and the second encapsulation dam on the base substrate, wherein a material of the at least one encapsulation dam is filled in the groove, and wherein the display panel further comprises a pixel definition layer formed in the display area, wherein each of the first encapsulation dam and the second encapsulation dam comprises a first barrier layer, and the first barrier layer and the pixel definition layer are formed of a same material and provided in a same layer.

11. The display device according to claim 10, wherein the projection of the groove on the base substrate is located within a projection of the second encapsulation dam on the base substrate.

12. The display device according to claim 10, wherein the display panel further comprises:

a crack detection line located in the peripheral area of the base substrate and arranged around the display area, wherein a projection of the crack detection line on the base substrate is located between projections of the first encapsulation dam and the second encapsulation dam on the base substrate, and the first encapsulation dam and the second encapsulation dam being adjacent to each other.

13. The display device according to claim 10, wherein the display panel further comprises:

a crack detection line located in the peripheral area of the substrate and arranged around the display area, wherein a projection of the crack detection line on the base substrate is located within a projection of at least one encapsulation dam of the plurality of encapsulation dams on the base substrate.

14. The display device according to claim 13, wherein the insulation layer covers the crack detection line and, in a covering area by the at least one encapsulation dam of the plurality of encapsulation dams, the crack detection line is located at a side of the groove near to or far from the display area.

15. A method for manufacturing a display panel, comprising:

providing a base substrate comprising a display area and a peripheral area surrounding the display area being divided;

forming an insulation layer covering at least the peripheral area of the base substrate;

forming a plurality of encapsulation dams located on a surface of the insulation layer away from the base substrate so that the plurality of encapsulation dams are located in the peripheral area of the base substrate and arranged around the display area, wherein the plurality of encapsulation dams comprise a first encapsulation dam and a second encapsulation dam, and the second encapsulation dam is higher than the first encapsulation dam and is arranged around a side of the first encapsulation dam away from the display area; and forming at least one groove in the insulation layer so that the groove is arranged around the display area, wherein a projection of the at least one groove on the base substrate is located within a projection of at least one encapsulation dam of the first encapsulation dam and the second encapsulation dam on the base substrate, wherein a material of the at least one encapsulation dam is filled in the groove, wherein the method further comprises: forming a pixel definition layer in the display area, and wherein each of the first encapsulation dam and the second encapsulation dam comprises a first barrier layer, and the first barrier layer and the pixel definition layer are formed of a same material and provided in a same layer.

16. The method for manufacturing the display panel according to claim 15, further comprising:

forming a crack detection line in the peripheral area of the base substrate and around the display area, wherein a projection of the crack detection line on the base substrate is located between projections of two adjacent encapsulation dams on the base substrate, or the projection of the crack detection line on the base substrate is located within a projection of at least one encapsulation dam of the plurality of encapsulation dams on the base substrate.

* * * * *